(12) United States Patent
Onsongo et al.

(10) Patent No.: US 9,405,311 B1
(45) Date of Patent: *Aug. 2, 2016

(54) BIAS-TEMPERATURE INDUCED DAMAGE MITIGATION CIRCUIT

(71) Applicant: International Business Machines Corporation, Armonk, NY (US)

(72) Inventors: David M. Onsongo, Manor, TX (US); David P. Paulsen, Inver Grove Heights, MN (US); Kirk D. Peterson, Jericho, VT (US); John E. Sheets, II, Zumbrota, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/736,344

(22) Filed: Jun. 11, 2015

Related U.S. Application Data

(63) Continuation of application No. 14/642,797, filed on Mar. 10, 2015.

(51) Int. Cl.
  *G05F 3/26* (2006.01)
  *H03K 19/094* (2006.01)
(52) U.S. Cl.
  CPC .......... *G05F 3/262* (2013.01); *H03K 19/09432* (2013.01)
(58) Field of Classification Search
  CPC .......... G05F 3/26; G05F 3/262; G05F 3/265; G05F 3/267
  See application file for complete search history.

(56) References Cited

U.S. PATENT DOCUMENTS

| | | | |
|---|---|---|---|
| 5,309,090 A | 5/1994 | Lipp | |
| 6,310,485 B1 | 10/2001 | McClure | |
| 6,407,596 B1* | 6/2002 | Taft | H03K 5/00006 327/116 |
| 6,507,241 B1* | 1/2003 | Ritter | H03F 3/45941 327/307 |
| 6,750,686 B2* | 6/2004 | Wang | H03K 23/667 327/115 |
| 6,762,624 B2 | 7/2004 | Lai | |
| 6,879,177 B1 | 4/2005 | Bolam et al. | |
| 7,449,919 B2 | 11/2008 | Lee et al. | |
| 7,535,261 B2* | 5/2009 | Yuuki | H03K 3/012 326/112 |
| 7,750,724 B2 | 7/2010 | Rengachari et al. | |
| 7,759,992 B2 | 7/2010 | Ibuka | |
| 7,924,069 B2* | 4/2011 | Narathong | H03K 21/10 327/117 |

(Continued)

OTHER PUBLICATIONS

Anonymous, "Device Degradation Monitoring Circuitry," An IP.com Prior Art Database Technical Disclosure, Nov. 2, 2006, pp. 1-5. IP.com No. IPCOM000142562D.

(Continued)

*Primary Examiner* — Thomas J Hiltunen
(74) *Attorney, Agent, or Firm* — Scott S. Dobson; Robert Williams

(57) ABSTRACT

A circuit that regulates electrical current flow through an integrated circuit involves a sequencing circuit connected to a clock signal generator, the sequencing circuit configured to, responsive to receiving a clock signal from the clock signal generator, generate a set of sequencing signals that includes a first switching signal, a second switching signal, and a disable signal. The circuit also involves a switching circuit connected to the sequencing circuit, the switching circuit configured to receive the first switching signal and the second switching signal and a current mirror connected to the switching circuit and the sequencing circuit, the current mirror configured to receive an activation signal from a current control logic circuit and to receive the disable signal.

15 Claims, 6 Drawing Sheets

(56) References Cited

U.S. PATENT DOCUMENTS

| | | | |
|---|---|---|---|
| 8,022,778 B2 | 9/2011 | Nagaraj et al. | |
| 8,049,527 B2 | 11/2011 | Lee | |
| 8,384,395 B2 | 2/2013 | Karnad et al. | |
| 8,525,716 B2 | 9/2013 | Bhatia et al. | |
| 8,836,394 B2 * | 9/2014 | Zerbe | H04L 7/0079 |
| | | | 326/82 |
| 8,847,628 B1 | 9/2014 | Yan et al. | |
| 8,963,532 B2 * | 2/2015 | Cui | G11C 7/14 |
| | | | 323/315 |
| 8,963,637 B2 | 2/2015 | Koba et al. | |
| 2011/0181340 A1 * | 7/2011 | Gazit | H03K 19/018521 |
| | | | 327/333 |

OTHER PUBLICATIONS

Anonymous, "A Method and System for Determining Performance Degradation due to Bias Temperature Instability using Interleaved Ring Oscillators," An IP.com Prior Art Database Technical Disclosure, Jan. 20, 2014, pp. 1-3. IP.com No. IPCOM000234584D.

Prilik, RJ, "High Speed Voltage Current Pulser," An IP.com Prior Art Database Technical Disclosure, Original Publication Date: Nov. 1, 1975, IP.com Electronic Publication: Mar. 2, 2005, pp. 1-3. IP.com No. IPCOM000084507D.

Onsongo et al., "Bias-Temperature Induced Damage Mitigation Circuit", U.S. Appl. No. 14/642,797, filed Mar. 10, 2015.

List of IBM Patents or Patent Applications Treated as Related.

* cited by examiner

BIAS-TEMPERATURE INDUCED DAMAGE MITIGATION CIRCUIT

BACKGROUND

The present disclosure relates to semiconductor circuits and the testing of integrated circuits. More particularly, the present disclosure describes a circuit that operates on a semiconductor circuit during burn-in testing in order to regulate the flow of electrical current through the semiconductor circuit. In many circumstances, semiconductor circuits can experience damage or degradation during burn-in testing. Such damage can include increases in the threshold voltage for an integrated circuit or electromigration in metal lines or at metal interfaces.

Current mode logic (CML) circuits are typically disabled during burn-in test and thus can be particularly sensitive to the degrading effects of bias-temperature induced (BTI) damage. Regulating the flow of electrical current through CML circuits during burn-in testing can preserve their performance after burn-in testing has been completed.

SUMMARY

Certain embodiments are directed toward a circuit that regulates the flow of electrical current through an integrated circuit, the circuit containing: a sequencing circuit connected to a clock signal generator, the sequencing circuit configured to, responsive to receiving a clock signal from the clock signal generator, generate a set of sequencing signals that includes a first switching signal, a second switching signal, and a disable signal. The circuit may also contain a switching circuit connected to the sequencing circuit, the switching circuit configured to receive the first switching signal and the second switching signal. The circuit may include a current mirror connected to the switching circuit and the sequencing circuit, the current mirror configured to receive an activation signal from a current control logic circuit and to receive the disable signal.

Some embodiments may be directed toward a method of regulating a flow of electrical current in an integrated circuit. The method may comprise: sending, by a current control logic circuit, an activation signal; generating, by a clock signal generator, a clock signal; and generating, by a sequencing circuit, from the clock signal, a set of sequencing signals that includes a first switching signal, a second switching signal, and a disable signal. The method may also include receiving by a switching circuit, the first switching signal and the second switching signal; and receiving, by a current mirror, the activation signal and the disable signal.

Various embodiments are directed toward a system comprising a clock signal generator that generates a clock signal; a current control logic circuit that sends an activation signal; a sequencing circuit, connected to the clock signal generator, that generates, responsive to receiving a clock signal, a set of sequencing signals that includes a first switching signal, a second switching signal, and a disable signal. The system may also include a switching circuit, connected to the sequencing circuit, that receives the first switching signal and the second switching signal; and a current mirror connected to the switching circuit and the sequencing circuit, that receives the activation signal and the disable signal and enables the flow of electrical current through the switching circuit.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
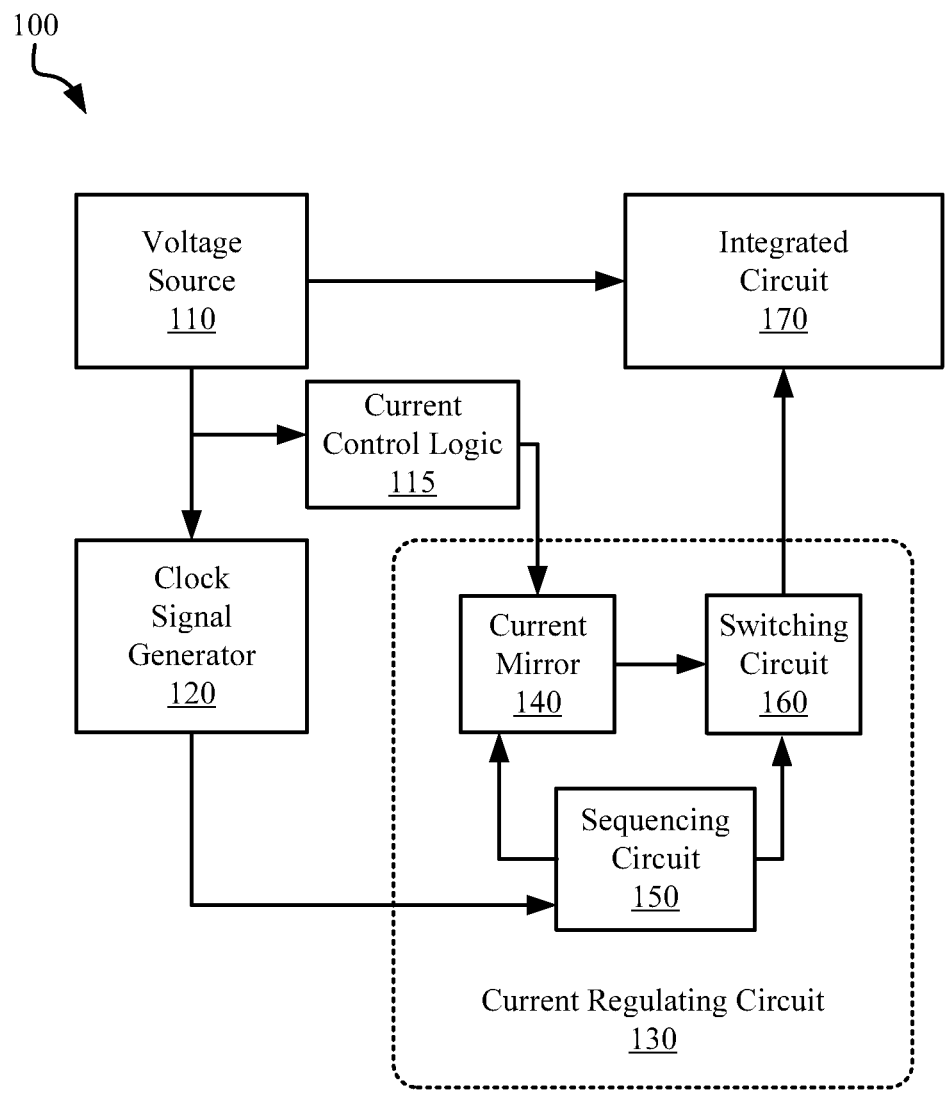
FIG. 1 depicts a system in which an integrated circuit experiences a regulated flow of electrical current, the regulated flow of electrical current being driven by a current regulating circuit, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to semiconductor circuits and methods for testing integrated circuits. More particularly, the present disclosure describes a circuit that operates on a semiconductor circuit during burn-in testing in order to regulate the flow of electrical current through the semiconductor circuit, as well a method of relieving high bias stress on field effect transistors in an integrated circuit during burn-in testing. While the present disclosure is not necessarily limited to such applications, various aspects of the disclosure may be appreciated through a discussion of various examples using this context.

Burn-in testing of integrated circuits is conducted to identify latent or benign defects that can cause chip or device failures. Burn-in testing places chips with integrated circuits in conditions of high voltage and temperature stress in order to induce failures that can appear at a later time after some period of operation. During burn-in testing, bias-temperature induced (BTI) damage can occur in field-effect transistors (FETs) when they are in an "off" state while being subjected to elevated temperatures and high bias conditions (stress). Periodically turning the FETs on can relax the stress, decreasing the likelihood that BTI damage occurs. However, CML circuits are disabled in order to reduce the likelihood of electromigration induced failure of copper interconnects, as well as reducing the risk of hot carrier induced (HCI) damage that can occur when high currents pass through FETs. The regulation of burn-in testing conditions, especially for technology nodes at or below 32 nm, may be relevant to reducing circuit damage as circuit elements scale.

According to embodiments of the present disclosure, it may be possible to "tune" the current-flow conditions of an integrated circuit during burn-in testing in order to reduce the relative likelihood of one of the aforementioned types of circuit damage occurring, while still placing a circuit under sufficiently stressful conditions to identify chips with latent defects that can be screened from installation in computing devices because of their elevated likelihood of failure. During burn-in testing, disabling a FET can lead to BTI damage because of the constant the high gate-to-drain V(gd) bias present during burn-in. Pulsing the gate on and off during burn-in testing can minimize BTI damage (by allowing a FET to "relax" during a portion of the burn-in time), however this may place copper interconnects at greater risk of electromigration as well as increase the risk of HCI damage as it allows currents to flow for a portion of the burn-in time.

A burn-in test cycle where electrical current flows part of the time, but not all of the time, can, according to embodiments, balance these various risks of damage. The amount of electrical current that can flow through branches of an integrated circuit during burn-in testing (i.e., the current flow duty cycle) to achieve a "balanced" operational regime may vary according to the circuit topology, the design rules for the circuit, the materials used to make the circuit, and the burn-in test conditions. Some embodiments may have a 50% duty cycle of current flow through the integrated circuit (i.e., through any branch at one time), while other integrated circuits may have current flow duty cycles that are much lower or much higher. The design of the sequencing circuit can, according to embodiments, significantly modify the timings of the sequencing signals that accomplish the desired current flow for a particular integrated circuit. The terms used herein to describe the sequencing circuit and the sequencing signals (switching signals and disable signal) should be interpreted broadly and not used to restrict the scope of the present disclosure to a single embodiment.

Current pulses through an integrated circuit can be created by making an active electrical pathway between an integrated circuit (or a branch of an integrated circuit) and a current source. The active electrical pathway may, according to embodiments, extend from a current source, through a current source FET (connected to the current source) and one or more switching FETs in a switching circuit, to the integrated circuit. There may be multiple branched pathways through a switching circuit, where each switching circuit branch can be selected by enabling or disabling one or more switching FETs with sequencing signals received from a sequencing circuit. The sequencing signals may be configured to enable coordinated operation of the switching FETs, allowing electrical current to flow in only one branch of an integrated circuit to relax the integrated circuit FETs from high V(gd) strain during a part of a clock cycle.

A sequencing circuit may receive a clock signal from a clock signal generator in order to generate and to sequentially modify sequencing signals that are routed to the switching circuit and to a current mirror (to the current source FET or to a disable FET). In some embodiments, a reference clock can provide a clock signal to the sequencing circuit. Some embodiments may include a ring oscillator to generate a clock signal. A sequencing circuit can modify the clock signal into various switching signals that can coordinate the operation of the current regulating circuit. Clock signal modifications can include phase changes (e.g., if the clock signal has a high clock signal voltage, some sequencing signals generated by the sequencing circuit may have low voltages) and frequency changes. While an inverter can produce a voltage state difference relative to the clock signal, a frequency divider can produce a sequencing signal that changes between high and low voltage states at different intervals than the clock signal.

Sequencing signals can be generated in repeatable patterns, according to embodiments of the present disclosure. Sequencing signals can be adjusted, according to the structure of the sequencing circuit and the pattern of the clock signal, to produce varying amounts of relaxation time in branches of an integrated circuit during a given regulatory cycle. A regulatory cycle consists of the smallest time in which each sequencing signal produced by the sequencing circuit proceeds from an initial state, through at least one complete sequencing of the respective sequencing signal cycle, back to the initial state. A regulatory cycle may also be described as having the same duration as the cycle of the slowest changing sequencing signal from an initial state back to the initial state, in some embodiments.

FIG. 1 depicts a system 100 in which an integrated circuit can undergo regulated (e.g., pulsed) current flow. The system 100 shows an integrated circuit 170 electrically connected to a voltage source 110 and to a current regulating circuit 130. The integrated circuit may be divided into several branches (or portions, or segments), each of which can experience a brief flow of electrical current triggered by the current regulating circuit. Current flow regulation can, in various embodiments, occur by taking a clock signal output from a clock signal generator 120 (powered by the voltage source 110) and directing the clock signal into a current regulating circuit 130. The clock signal generator 120 may include a reference clock for an integrated circuit, or some form of oscillator such as a ring oscillator. Various embodiments may include other forms of clock signal generators that are compatible with the different kinds of current regulating circuits that can be connected to integrated circuits during burn-in testing.

The current regulating circuit 130 may further include a sequencing circuit 150 that receives the clock signal from the clock signal generator 120. The sequencing circuit 150 can generate and send a set of sequencing signals to different parts of the current regulating circuit 130 in order to activate switching circuit field effect transistors (FETs) and thus control which branch of the integrated circuit 170 can experience a flow of electrical current during a part of a clock cycle.

In embodiments, a clock signal generated by a clock signal generator can be a modulated voltage signal that transitions between a low clock signal voltage to a high clock signal voltage. A clock signal may include two such clock signal transitions in each clock cycle, and such clock signal transitions can be used to identify the beginning, the middle, and the end of a clock signal cycle. Clock cycles can begin with a clock signal transition, and a single clock cycle can end when the clock signal undergoes a clock signal transition (up or down in voltage) similar to the transition at the beginning of the cycle.

In embodiments, components that receive a clock signal can produce an output signal that responds to changes in the clock signal. Such responsive changes can occur, for example, upon a clock signal transition reaching a component to cause the component output to alter. Output signals (including switching signals and a disable signal) can trigger a response in the current regulating circuit 130 by modifying the activation status of switches (including switching FETs) in a switching circuit 160 or in the current mirror 140. When switches change status, they can reroute the path that electrical current follows through the current regulating circuit.

Circuit components that can modify a clock signal to generate modified output signals include inverters and frequency dividers. Inverters can change the phase of the input signal, by converting a high voltage input signal to a low voltage output signal. Frequency dividers modify the frequency of signal transitions in the output signal relative to the input signal received by the frequency divider. In some embodiments, a sequencing circuit in a current regulating circuit may contain one or more "divide by two" frequency dividers that generate a divider output signal that changes at half the rate of the signal received by the divide by two frequency divider. According to embodiments, frequency dividers are not restricted to "divide by two" frequency dividers, but can include a wide range of frequency transformations.

A sequencing circuit 150 that includes inverters and frequency dividers can, in various embodiments, transform a single clock signal input into multiple output signals (a set of sequencing signals), that changes with each clock signal transition. Each sequencing signal generated by the sequencing circuit 150 can be directed to a different part of the current regulating circuit 130 in order to modulate the activity of switching circuit components in a predetermined order.

According to embodiments, a set of sequencing signals can follow a repeatable pattern of varying complexity, the complexity relating to the structure of the current mirror 140 and the switching circuit 160. During burn-in testing, as the sequencing circuit produces sequencing signals, a pulse of electrical current can flow through different branches or portions of an integrated circuit. When switches such as switching FETs and a current source FET are connected in series and are activated by the sequencing signals, current can flow to relieve the high V(gd) stress on the integrated circuit FETs. In some embodiments, a disable signal (in the set of sequencing signals) may deactivate a current source FET in the current mirror 140, preventing current from flowing through the switching circuit and any interconnected parts of the integrated circuit.

The current regulating circuit may, according to embodiments, be enabled by a logic circuit within or outside the current regulating circuit. A current control logic circuit 115, whether part of or outside of the current regulating circuit 130, can be powered by the voltage source 110 and transmit an activation signal to the current regulating circuit 130 according to circuits that are hardwired into the current control logic circuit 115, or according to software instructions that are stored in or received by the current control logic circuit 115. In some embodiments, the current control logic circuit 115 may connect to control circuitry between the clock signal generator 120 and the sequencing circuit 150. Some embodiments may have a current control logic circuit that connects to routing switches (routing FETs) between an integrated circuit 170 and a switching circuit 160 that, when activated, direct electrical current to the switching circuit 160 upon receipt of the activation signal. Various embodiments of current regulating circuit 130 elements can be used to implement the regulation of current through an integrated circuit, as described herein. The particular examples described are not intended to denote limitations, but to act as examples representative of the concepts contained in the present disclosure.

According to embodiments, when the current control logic circuit 115 enables current flow through the current mirror 140, and when the sequencing circuit applies a set of sequencing signals to the current mirror 140 and the switching circuit 160 (where the set of sequencing signals enables current flow through at least one switching gate in the switching circuit 160), electrical current can flow through one portion of the integrated circuit 170. The plurality of sets of sequencing signals can be configured to cycle repeatedly through a pattern of sequencing signals in order to control the current mirror 140 and the switching circuit 160. According to embodiments of the present disclosure, the current control logic circuit 115 may also regulate the clock signal output from the clock signal generator supplied to the current regulating circuit 130.

Figure 2:
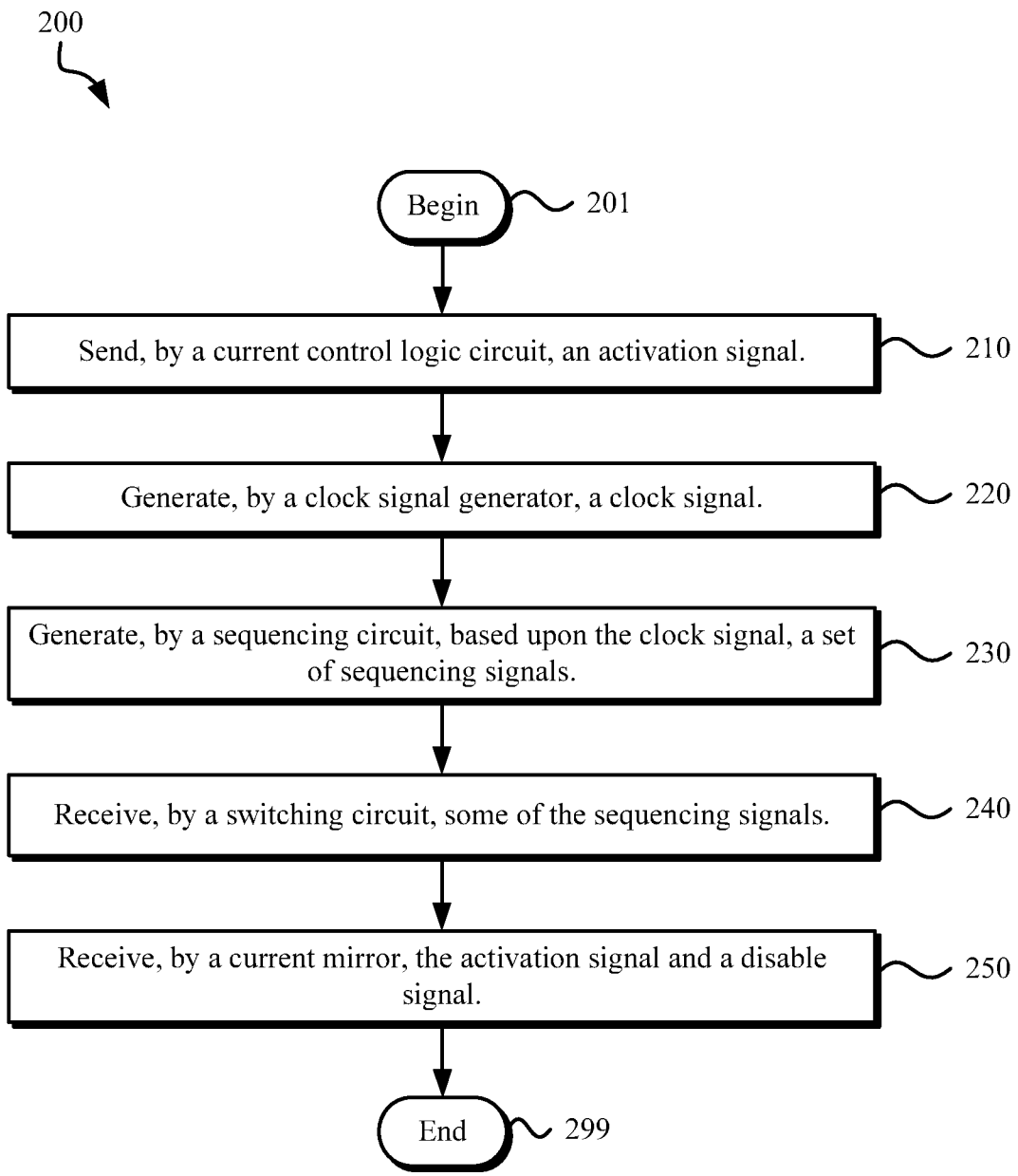
FIG. 2 describes a method of reducing bias-temperature induced (BTI) damage in an integrated circuit, according to embodiments.

FIG. 2 describes a method 200 of regulating the flow of electrical current in an integrated circuit connected to a current regulating circuit, according to embodiments of the present disclosure. The method begins in block 201. The method may include sending an activation signal to a current regulating circuit similar to that described in FIG. 1, in order to initiate the period pulsed flow of electrical current in an integrated circuit, as shown in block 210. The activation signal may be a simple voltage pulse or transition, or may be a more complicated signal, according to embodiments, that can activate the operation of a passgate FET within a current mirror in order to allow electrical current to flow through the current mirror into the integrated circuit. The activation signal can, according to embodiments, be generated by a current control logic circuit. The current control logic circuit may be a circuit element that receives operational instructions from a central processing unit or other source elsewhere in the integrated circuit, or from outside the integrated circuit. The current control logic circuit can, according to some embodiments, be a general processing logic circuit, or can be hard coded to operate when temperature limits climb above a threshold and when the integrated circuit is subjected to voltage conditions consistent with burn-in testing.

The method may also include generating a clock signal using a clock signal generator, as described in block 220. The clock signal generator can be a reference clock in an integrated circuit, or can be a ring oscillator, according to embodiments. The method may also include a step wherein a sequencing circuit generates, based upon the clock signal, a set of sequencing signals that are transmitted to other parts of the current regulating circuit to operate the circuit and allow pulses of electrical current to flow through the integrated circuit, as shown in block 230. According to embodiments, the sequencing circuit can contain inverters and frequency dividers that manipulate the clock signal (or modified signals that are generated from the clock signal) to produce modified signals that can be distributed through the current regulating circuit to operate the current regulating circuit. The sequencing circuit can be configured to automatically produce modified output signals upon receiving a clock signal input from a clock signal generator, and to produce repeating patterns of sequencing signals from the sequencing circuit components.

The method can further include the receiving, by a switching circuit, of some of the sequencing signals, according to block 240. The receiving of the sequencing signals can serve to activate or deactivate switching FETs in the sequencing circuit to create active electrical pathways through the hierarchical structure of current mode logic (CML) books in a switching circuit. Some embodiments may generate a pair of switching signals that are received by the switching circuit in order to operate a pair of switching FETs in a single CML book in the switching circuit. Various embodiments may have a switching circuit that receives four (or more) switching signals, in order to coordinate the operation of stacked CML books within the switching circuit. Some switching signals received by the switching circuit may undergo signal transitions between high and low voltages with the same frequency that the clock signal undergoes signal transitions. Some switching signals, especially in multi-CML book switching circuits, can undergo signal transitions at lower frequencies than the clock signal that is received by the sequencing circuit. In some embodiments, switching signals with various signal transition frequencies can be simultaneously received by a switching circuit in order to create active electrical pathways through the switching circuit.

The method may also include the receiving, by a current mirror, of the activation signal and a disable signal, according to block 250. The activation signal received by the current mirror may activate a switch such as a passgate FET in the current mirror. The passgate FET may be configured to enable a static bias voltage V(bias) or other signal to reach the current mirror bridge and activate the current source FET within the current mirror. The current mirror may also receive a disable signal in order to temporarily halt the flow of electrical current through any portion of the integrated circuit to which a current regulating circuit is connected. According to embodiments, the disable signal can be received by a disable FET in the current mirror in order to route the bias voltage signal to ground rather than activating a current source FET in the current mirror. The method ends in block 299.

Figure 3:
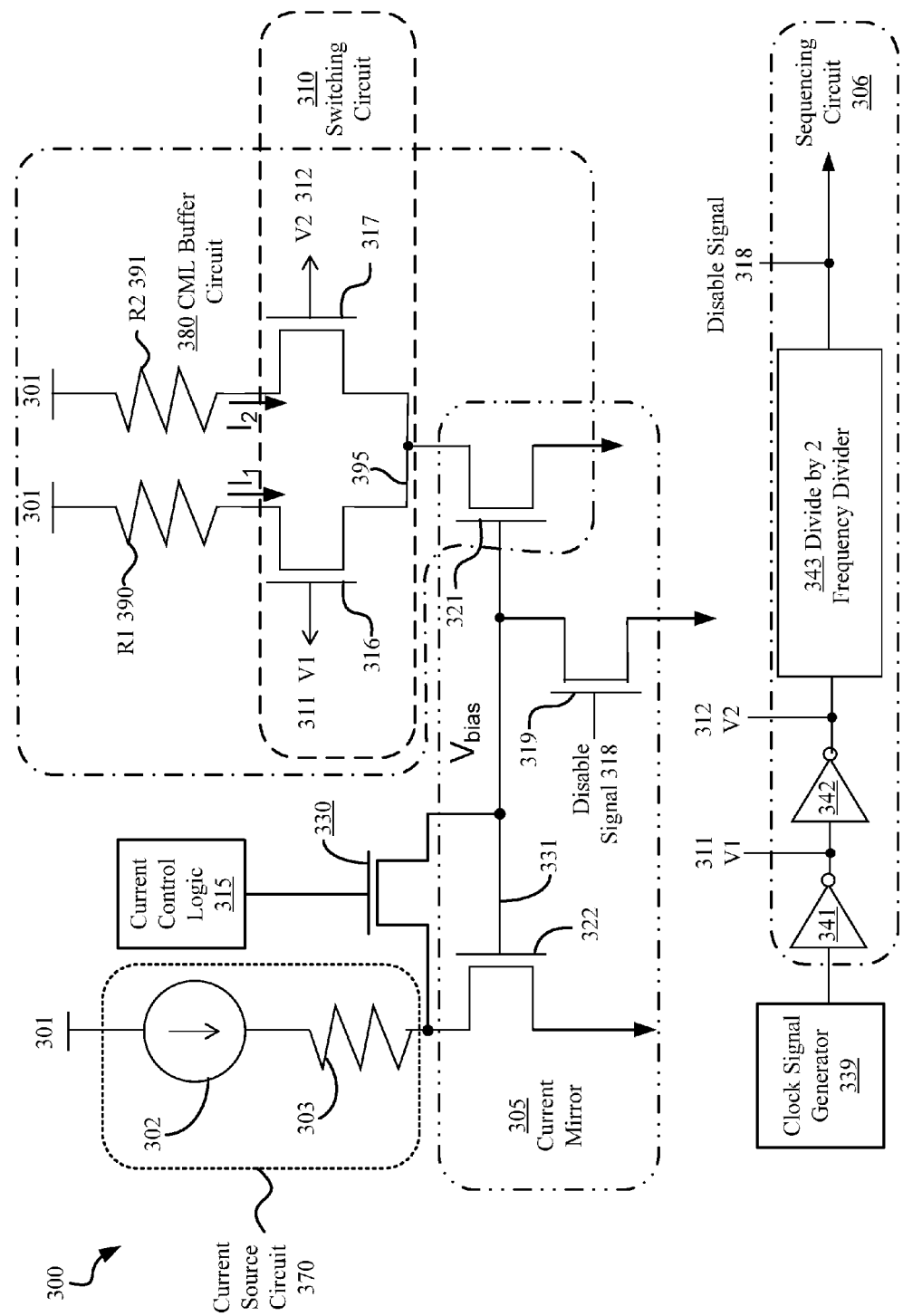
FIG. 3 depicts an integrated circuit in a current mode logic circuit, where the integrated circuit is divided into at least two branches, according to embodiments.

FIG. 3 depicts a regulated current mode logic (CML) circuit 300 containing a sequencing circuit 306 connected to a CML buffer 380 and to the disable FET 319 in the current mirror 305. A power supply voltage source 301 connects to a first branch 390 (resistive load one, R1) and a second branch 391 (resistive load two, R2) of the CML buffer. The voltage source 301 may also be connected to a current source circuit 370 represented by current source 302 and source resistor 303. The current source circuit 370 is connected to the drain of the bias FET 322 and drain of the passgate FET 330. The source of the passgate FET 330 is connected to the gates of the bias FET 322, drain of the disable FET 319 and gate of the CML buffer current source FET 321. The bias FET 322 and CML Buffer current source FET 321 form the current mirror 305 that can be turned off by the disable FET 319 or the passgate FET 330. The drain of CML Buffer current source FET 321 is connected to the sources of the switching circuit FETs 311 and 312. The ratio of total channel width between bias FET 322 and current source FET 321 can determine the multiplication factor of the current mirror 305 and the amount of current steered to resistor loads 390 and 391.

A passgate FET 330 may be positioned in the electrical circuit in order to activate or deactivate the current mirror 305. The gate of the passgate FET 330 may be connected to the output of a current control logic 315 that sends an activation signal to the passgate FET 330 at some point before or during the process of burn-in testing in order to activate the current regulating circuit. In some embodiments, the current control logic 315 may be configured to receive an input from a sequencing circuit in order to route current through a resistive load 303 in the current source circuit 370. In some embodiments, the current control logic circuit may be configured to receive an input from some other source in order to turn current flow through the current source circuit 370 on or off. The passgate FET 330 may also receive a deactivation signal during or after burn-in testing in order to turn off the current regulating circuit.

The current mirror bridge line 331 may be further connected to the drain of a disable FET 319. The disable FET 319 may be connected, by its gate, to a sequencing circuit 306. More particularly, a disable signal 318 generated by a sequencing circuit 306 may be directed to the gate of a disable FET 319 in order to periodically disable the flow of electrical current through the current source FET 321 during burn-in testing.

The sequencing circuit 306 in a current regulating circuit 300 can have a number of circuit elements that drive the operation of the current mirror 305 and the switching circuit 310 to create active electrical pathways through portions of the integrated circuit being tested. A clock signal generator 339 can be configured to produce a clock signal output that is received by the sequencing circuit 306. The sequencing circuit 306 can include several circuit elements that modify the clock signal to create sequencing signals that coordinate the operation of the current regulating circuit 300. Sequencing signals can include a disable signal 318 and a plurality of switching signals that activate switching FET gates in the switching circuit 310. The outputs of the various circuit elements in the sequencing circuit 306 can be connected to the various FET gates in the current regulating circuit 300 to convey the sequencing signals created from the clock signal input.

Figure 5:
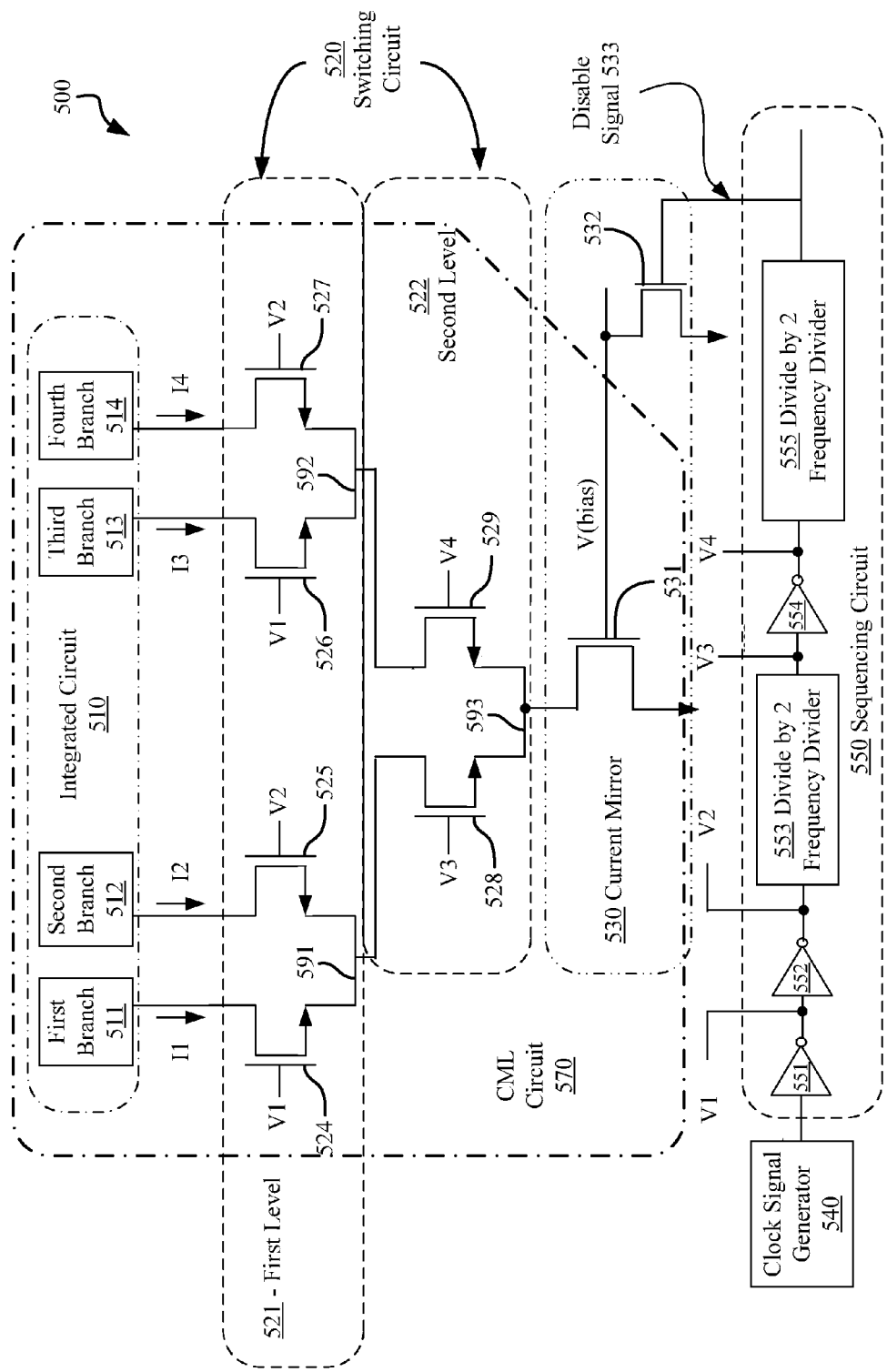
FIG. 5 depicts an integrated circuit in a current mode logic circuit, the integrated circuit being divided into at least four branches, according to embodiments.

The precise configuration of sequencing circuits may be simple or quite complex, according to embodiments. The present disclosure is intended to describe the characteristics of a sequencing circuit without limiting the possible embodiments that may actually create sequencing signals that drive the coordinated operation of a current regulating circuit as described herein. In some embodiments, a sequencing circuit can have two inverters 341 and 342 connected in sequence between the clock signal generator 339 and a divide by two frequency divider 343. Each inverter can be configured to receive an input and to provide a modified output in an opposite phase (e.g., a high voltage input to an inverter can produce a low voltage output) from the inverter's input. In embodiments, the output of first inverter 341 (first switching signal 311, V1) can be directed to the gate of first switching FET 316 in the switching circuit 310. The output of second inverter 342 (second switching signal 312, V2) can be directed to the gate of a second switching FET 317 in the switching circuit 310. A pair of switching FETs that have interconnected sources, such as first switching FET 316 and second switching FET 317, form a current mode logic book (CML book) 395 in the switching circuit 310. A switching circuit with a single CML book can be called a one-level switching circuit. In some embodiments, CML books can be connected to each other where the interconnected sources of one CML book further connect to the source of one side of another CML book, forming a branched circuit structure that connects to portions of an integrated circuit. A switching circuit with two CML books connected in series can be called a two-level switching circuit. For an example of a two-level switching circuit with this branched structure, see CML books 591 and 593 as shown in FIG. 5.

In some embodiments, the two sides of a CML book are operated individually because the individual switching signals that activate the two sides of the CML book are out of phase with each other. For example, a clock signal and a second switching signal 312 may be in phase because the second switching signal has been generated by passing the clock signal through two inverters in the sequencing circuit 306. The first switching signal 311 can generally be described as out of phase with the clock signal because it is generated by passing the clock signal through a single inverter in the sequencing circuit 306.

Some embodiments may use the clock signal instead of the output of a second inverter in order to drive a second switching FET 317 because the clock signal and the output of a second inverter can have high and low values at the same time (the clock signal and second inverter output are in phase with each other). Each of the first and second switching signals can, according to embodiments, activate one switching FET in a CML book to create an active electrical pathway through one branch of the CML book. In some embodiments, such as those containing two-level switching circuits similar to that shown in FIG. 5, CML books may be interconnected such that an active electrical pathway is created only when one gate in each of two CML books connected in series are switched on or enabled. For example, when the gates on switching FETs 526 and 529 are simultaneously activated by high voltage switching signals, electrical current can flow through the switching circuit from the current source FET to the connected branch of the integrated circuit (provided that the current source FET is activated and the disable signal has a low voltage).

According to embodiments, a divide by two frequency divider 343 can receive a signal having a particular signal transition frequency and produce a modified output signal with half the signal transition frequency of the received signal. Some embodiments of current regulating circuits may have frequency dividers that perform frequency reductions at different ratios compared to the input signal (e.g., divide by three, divide by four, divide by eight, etc.).

As described herein, the disable signal 318 generated by the frequency divider 343 may be transmitted to a disable FET 319 in a current mirror 305. The disable signal 318 can have a different transition frequency than the switching signals generated prior to the frequency divider 343 in the switching circuit 306. Thus, the first switching signal 311 and the second switching signal 312 can each activate, in turn, a switching FET in the CML book 395 while the disable signal 318 has a low voltage. Upon the disable signal 318 transitioning to a high voltage, the current source FET 321 is deactivated and the first and second switching signals can again cycle through the respective high voltage parts of their signals even though the current cannot flow through the current mirror 305, switching circuit 310, and the integrated circuit. The design of the sequencing circuit 306 can be such that this cycle of FET activation and deactivation continues in a predictable pattern for as long as the current control logic 315 applies the activation signal (or does not send the deactivation signal) to the passgate FET 330.

Figure 4:
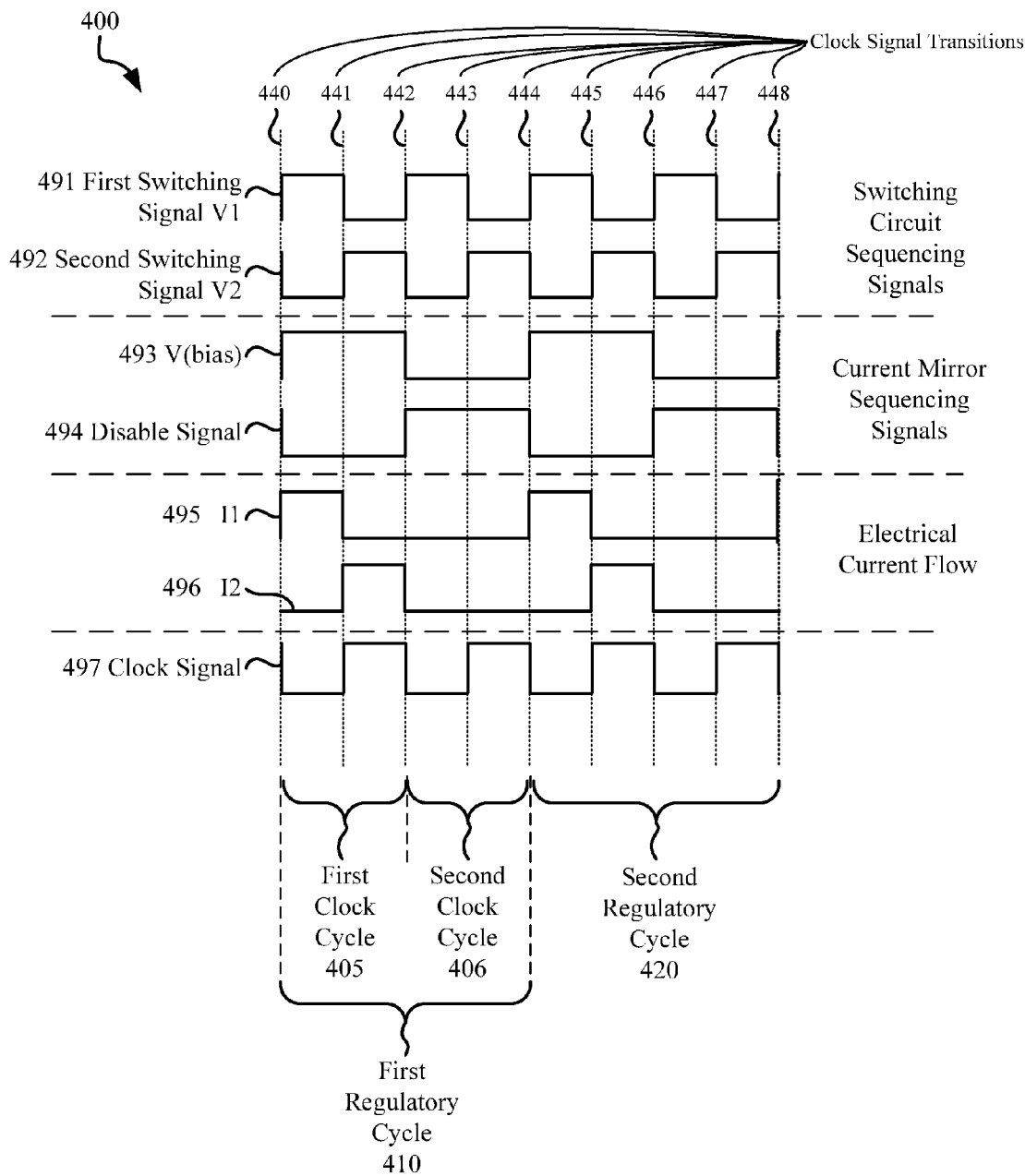
FIG. 4 portrays a waveform table for an integrated circuit having two branches, each branch being connected to one side of a current mode logic (CML) book, according to embodiments.

FIG. 4 portrays a waveform table 400 for a current regulating circuit connected to an integrated circuit with two branches (e.g., with a single-level switching circuit), according to embodiments. The voltages, currents, and clock signal described in the waveform table 400 generally correspond to voltages, currents, and clock signals that can be observed in embodiments of the present disclosure that correlate with integrated circuits and current regulating circuits similar to those described in FIG. 3.

The first switching signal 491, second switching signal 492, and disable signal 494 are sequencing signals that control the performance of the current regulating circuit. A clock signal 497 is received by a sequencing circuit from a clock signal generator. A bias voltage (V(bias)) 493 can be measured at the gate of a current source FET similar to current source FET 321 in FIG. 3. The flow of electrical current through a first branch of an integrated circuit (495 I1) and a second branch of the integrated circuit (496 I2) can be measured between first branch 390 and the first switching FET 316, and the second branch 391 and the second switching FET 317, respectively. A first regulatory cycle 410 includes a first clock cycle 405 and a second clock cycle 406 and has four clock cycle transitions 440, 441, 442, and 443. A second regulatory cycle 420 has four clock cycle transitions 444, 445, 446, and 447 and the patterns of the sequencing signals, V(bias), and currents match the patterns observed in the first regulatory cycle 410.

At the bottom of the waveform table 400, the voltage of a clock signal 497 is portrayed over a plurality of clock cycles as it undergoes multiple clock signal transitions 440 through 447. The clock signal 497 alternates between a low clock signal voltage and a high clock signal voltage two times during a clock cycle: once in the middle, and once at the end. According to embodiments of current regulating circuits such as those portrayed in FIG. 3 (with one-level switching circuits), when clock signal 497 has a low clock signal voltage, during the first half of a clock signal such as between clock signal transitions 440 and 441, or clock signal transitions 442 and 443, the first switching signal 491 (V1) has a high voltage because it is created by routing the clock signal through a single signal inverter such as inverter 341 in FIG. 3. During the second half of a clock cycle such as between clock signal transitions 441 and 442, or clock signal transitions 443 and 444, the clock signal has a high clock signal voltage, causing the inverter-modified first switching signal 491 to change to have a low voltage. The first switching signal 491 and the second switching signal 492 change between high and low voltage states with each transition of the clock signal between high and low clock signal voltage states.

A second switching signal 492 (V2) can be generated in a sequencing circuit by taking the first switching signal 491 and passing it through a second inverter such as inverter 342 in FIG. 3. According to embodiments, when clock signal 497 has a low voltage (and the first switching signal 491 has a high voltage, as is the case after clock signal transitions 440, 442, 444, and 446), the second switching signal 492 will be low. Further, when clock signal 497 has a high voltage as in the second half of a clock cycle (as after clock signal transitions 441, 443, 445), the second switching signal 492 will, like the clock signal, have a high voltage.

When a current regulating circuit is activated, such as by receiving an activation signal from a current control logic circuit 315 at passgate FET 330 in FIG. 3, a bias voltage (V(bias)) 493 is applied to both the gate of the bias FET 322 and the gate of the current source FET 321 in the current mirror of the current regulating circuit. Accordingly, the bias voltage 493 will be high until the disable FET (see disable FET 319 in FIG. 3) is activated. A disable FET can be activated when the disable signal 494 has a high voltage, causing current to flow through the disable FET and lowering the voltage on the current source FET 321 gate. While the first switching signal 491 and the second switching signal 492 change states (e.g., from high to low, or from low to high) twice during a single clock cycle, the bias voltage V(bias) 493 and the disable signal 494 change state once during a clock cycle.

In embodiments such as that shown in FIG. 3, a regulatory cycle corresponds to the passage of the disable signal 494 through a complete signal pattern and back to the initial state that existed at the start of the regulatory cycle. The periodic interruption of burn-in testing by flowing electrical current through branches of the integrated circuit can mitigate or eliminate the bias-temperature induced damage that occurs in extended burn-in test scenarios, and can maintain FETs in operable condition. In some embodiments, the duty cycle of current flow through any branch of the integrated circuit can be 50% or less, depending on the configuration of the sequencing circuit used to generate the disable signal that regulates the disable FET.

The waveform table 400 indicates that electrical current can flow through the branches of an integrated circuit attached to a current regulating circuit when the bias voltage V(bias) 493 at the current source FET gate is high, and when one of the signal voltages is also high. Thus, between clock signal transitions 440 and 441 (and between 444 and 445), electrical current can flow through a first branch of an integrated circuit, while between clock signal transitions 441 and 442 (and between 445 and 446) electrical current can flow through a second branch of an integrated circuit. Between clock signal transitions 442 and 444 (and between 446 and 448), current does not flow through the integrated circuit because the disable signal 494 has a high voltage and V(bias) 493 is low.

FIG. 5 shows a circuit 500 wherein a current mode logic (CML) circuit 570 with an integrated circuit 510 having four branches: a first branch 511, a second branch 512, a third branch 513, and a fourth branch 514, is connected to a sequencing circuit 550 that can coordinate pulses of electrical current through the branches. Integrated circuit 510 is connected to a switching circuit 520, each branch in the integrated circuit being connected to one side of a current mode logic (CML) book. The circuit further includes a clock signal generator 540, a sequencing circuit 550, and a current mirror 530 having a bias FET (not shown), a current source FET 531 and a disable FET 532. The clock signal generator 540 generates a clock signal that is transmitted to the sequencing circuit 550.

The sequencing circuit 550, upon receiving the clock signal, generates, based upon the clock signal, a set of sequencing signals that control the operation of field effect transistors in the switching circuit 520 and in the current mirror 530. The sequencing circuit 550 is configured to generate a repeating pattern of sequencing signals, where each sequencing signal repeats at least one time during the course of a regulatory cycle as the current regulating circuit operates during burn-in testing. In current regulating circuits with two-level switching circuits, an active electrical pathway can be formed by activating, in addition to the current source FET 531, two switching FETs connected in series between a branch of the integrated circuit 510 and the current source FET 531.

The switching circuit 520 has a first level 521 and a second level 522 of switching FETs, arranged into three current mode logic (CML) books. The first level includes a first CML book 591 and a second CML book 592. The second level has a third CML book 593. Each current mode logic book includes a pair of switching FETs, electrically interconnected at their sources to form a branched circuit structure. Upon receiving switching signals at the gates of the switching FETs in a CML book, one of the two switching FETs in the CML book can be activated and while the other remains in a resting state. The first CML book 591 includes a first switching FET 524 and a second switching FET 525 interconnected at their sources. The second CML book 592 includes a third switching FET 526 and a fourth switching FET 527, also interconnected at their sources. In the second level 522, a third CML book 593 is made of a fifth switching FET 528 and a sixth switching FET 529, interconnected at their sources.

A hierarchical switching structure can be created by joining the interconnected sources of the first CML book 591 with the drain of the fifth switching FET 528, the interconnected sources of the second CML book 592 with the drain of the sixth switching FET 529, and the interconnected sources of the third CML book 593 with the drain of the current source FET 531. Branches, or portions, of the integrated circuit 510 connect to the various switching FETs as follows: the first branch 511 connects to the drain of the first switching FET 524; the second branch 512 of the integrated circuit connects to the drain of the second switching FET 525; the third branch 513 of the integrated circuit connects to the drain of the third switching FET 526; and the fourth branch 514 of the integrated circuit connects to the drain of the fourth switching FET 527.

The current mirror 530 includes a current source FET 531 and a disable FET 532. The drain of the disable FET 532 is electrically connected to the bias FET (not shown in FIG. 5) and to the gate of the current source FET 531. When a current regulating circuit is activated, a bias voltage (V(bias)) can be applied to the gate of the current source FET 531, activating the current source FET and enabling current flow through some branch of the integrated circuit 510 selected by the switching FETs activated by the present switching signals from the sequencing circuit. When a disable signal 533 (with a high voltage) is received from the sequencing circuit, however, the current source FET 531 is deactivated and current flow through the switching FETs ceases.

The clock signal generator 540, electrically connected to the sequencing circuit 550, provides a signal that can be transformed into sequencing signals by the sequencing circuit. A first inverter 551 input may receive the clock signal 540 and invert the clock signal to create a first modified signal, the first switching signal V1. The first inverter 551 output can be connected to the gates of the first switching FET 524 and the third switching FET 526 in order to provide the first switching signal to the gates of the first and third switching FETs, respectively. The output of the first inverter 551 may also be connected to second inverter 552 input and the signal converted again, to produce a second modified signal, the second switching signal V2. The output of the second inverter may be electrically connected to the gates of the second switching FET 525 and the fourth switching FET 527 in order to activate them during part of a clock cycle.

The second inverter 552 output may be connected to the input of a first divide by two frequency divider 553 such that the first frequency divider 553 may receive the second modified output (the second switching signal V2) and generate a third modified output, a third switching signal V3. Because the third switching signal V3 has passed through divide by two frequency divider 553, it transitions between high voltage and low voltage states at half the signal transition frequency of the clock signal, the first switching signal, and the second switching signal. The third switching signal V3 can be directed to the gate of the fifth switching FET 528 (in the third CML book, 593) in order to activate the fifth switching FET 528 according to the voltage of the third switching signal V3. The first divide by two frequency divider 553 output can be connected to the input of a third inverter 554 in order to provide the third inverter 554 with a frequency divided input signal that acts as the third switching signal V3. The third inverter can invert the third switching signal V3 to generate a fourth switching signal V4. The output of the third inverter can be directed to the gate of the sixth switching FET 529 (to provide the fourth switching signal V4 to regulate the sixth switching FET 529), and to the input of a second divide by two frequency divider 555. The second divide by two frequency divider may convert the fourth switching signal V4 into a disable signal 533 that is routed to the gate of the disable FET 532 in the current mirror 530.

Switching FETs in a given CML book receive switching signals generated on different sides of an inverter in the sequencing circuit 550 and that have the same signal transition frequency. The first level 521 of the switching circuit 520 is configured, according to embodiments, to receive switching signals that undergo signal transitions with the same frequency as the clock signal generated by the clock signal generator 540. The third and fourth switching signals that are received by the second CML book 592, have a transition frequency that is half that of the clock signal and the first and second switching signals V1 and V2. The disable signal 533, being transmitted to the gate of the disable FET 532 from the output of second divide by two frequency divider 555 has a signal transition frequency that is half that of the third and fourth switching signals, and one fourth that of the first and second switching signals.

Figure 6:
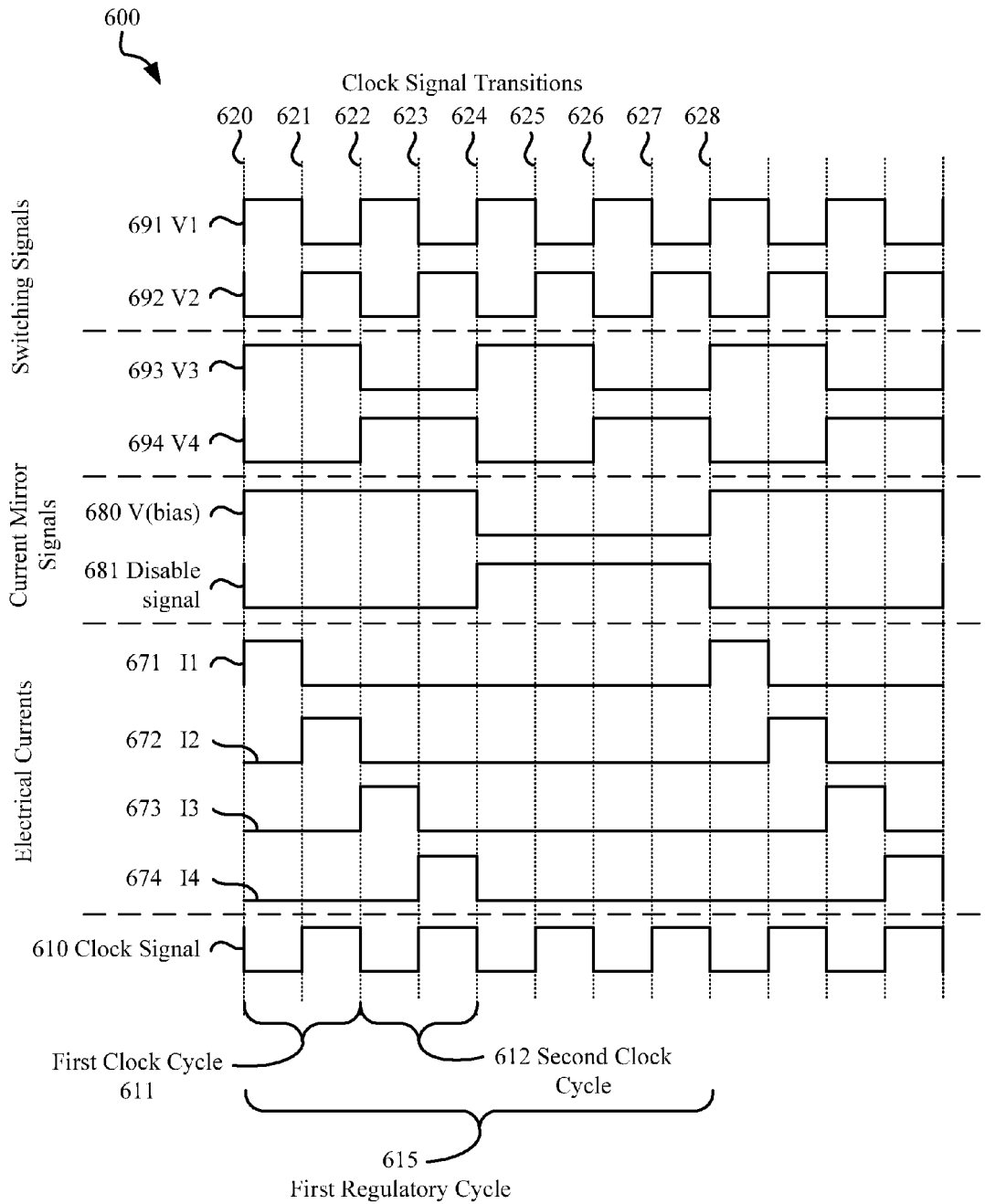
FIG. 6 shows a waveform diagram for a current regulating circuit connected to an integrated circuit that is divided into at least four branches, according to embodiments.

FIG. 6 shows a waveform table 600 for an integrated circuit, having at least four branches, that is connected to a current regulating circuit, according to embodiments. The voltages, currents, clock signals, and clock signal transitions associated with the waveform table 600 are generally consistent with embodiments of current regulating circuits similar to those described in FIG. 5. Structural elements described hereafter are intended to describe circuit elements similar to those shown in FIG. 5, to describe positions in such circuits where currents and voltages can be measured, and to describe the behavior of such circuits in response to the sequencing signals that they generate during operation. References made herein to FIG. 5 are intended to be interpreted broadly to all embodiments that have two-level switching circuits and perform the regulating function described herein.

A first switching signal 691 (V1, FIG. 5), a second switching signal 692 (V2, FIG. 5), a third switching signal 693 (V3, FIG. 5), and a fourth switching signal 694 (V4, FIG. 5) are sequencing signals generated by the sequencing circuit that control the performance of the current regulating circuit. A disable signal 681 is also a sequencing signal generated by the sequencing circuit that regulates the operation of a current source FET in a clock mirror of the current regulating circuit. A clock signal 610, transmitted from a clock signal generator to a sequencing circuit, can be transformed into sequencing signals by the sequencing circuit in order to coordinate the operation of the current regulating circuit. A bias voltage V(bias) 680 can be measured at a gate of a current source FET such as current source FET 531. Branch electrical currents I1 671, I2 672, I3 673, and I4 674 can each be measured at a point along an active electrical pathway between the current source and the respective branch of an integrated circuit that is connected to the current regulating circuit.

A first clock cycle 611 begins with clock signal transition 620 and ends with clock signal transition 622. A second clock cycle 612 of clock signal 610 begins with clock signal transition 622 and ends with clock signal transition 624. During the first clock cycle 611 and the second clock cycle 612, the disable signal 681 has a low voltage.

A first regulatory cycle 615 begins at clock signal transition 620 and ends at clock signal transition 628, having spanned four clock cycles and eight clock signal transitions. During the first half of the first regulatory cycle 615, the disable signal 681 has a low voltage, and in the second half (ending at clock signal transition 628) the disable signal 681 has a high voltage. During the first half of the first regulatory cycle 615, corresponding to first clock cycle 611 and second clock cycle 612, and in embodiments such as are described by FIG. 5, electrical current can flow through a current source FET 531, while in the second half of the first regulatory cycle 615, the current source FET 531 cannot pass an electrical current because the disable FET 532 has been activated. According to embodiments, the duty cycle of electrical current flowing through the current source FET 532 is approximately 50% (4/8) of the first regulatory cycle 615. As electrical current can flow through a branch of the integrated circuit 510 during half of a clock cycle, the duty cycle of electrical current flowing through any one branch of the integrated circuit 510 is approximately 12.5% (1/8) of the first regulatory cycle 615.

The clock signal 610 generated by a clock signal generator such as a clock signal generator 540 can be converted by a sequencing circuit 550 into a plurality of switching signals and a disable signal 681. More particularly, clock signal 610 can be converted into a first switching signal 691 by passing through a first inverter 551, and the first switching signal 691 can be converted into a second switching signal 692 by being passed through a second inverter 552. First switching signal 691 and second switching signal 692 share the same signal transition frequency as the clock signal 610, changing between high and low voltage states with consecutive clock signal transitions: 620, 621, 622, 623, 624, 625, 626, and 627.

The third switching signal 693 and the fourth switching single 694 change between high and low voltage states with alternate clock signal transitions, such as 620, 622, 624, and 626. This lowered transitional frequency results from the third and fourth switching signals, being drawn from the sequencing circuit 550 after the signal passes through a divide by two frequency divider 553. The third switching signal 693 can exit the sequencing circuit 550 at a point connected to the output of the divide by two frequency divider 553, while the fourth switching signal 694 can be generated (in an opposite phase to the third switching signal 693) by passing the third switching signal 693 through a third inverter 554 in the sequencing circuit 550.

A disable signal 681 can be generated within the sequencing circuit 550 by passing the fourth switching signal 694 through a second divide by two frequency divider 555. The disable signal 681 can be routed to the gate of a disable FET 532 in order to periodically prevent the flow of electrical current through a current source FET 531, putting the current regulating circuit and the integrated circuit 510 into a resting state during burn-in testing.

A hierarchy of control of sequencing signals on a current regulating circuit can be described as follows. First, the state of the disable signal 681 determines whether current source FET will be activated: when the disable signal 681 has a high voltage, the current source FET will be deactivated (and the disable FET will be activated); and when the voltage is low, electrical current can flow through the current source FET, some pathway through the switching circuit 520, and some branch of the integrated circuit 510. The duty cycle of the disable FET allowing electrical current to flow is approximately 50% (4/8 of the first regulatory cycle 615). Other current flow duty cycles are envisioned, and may be implemented, according to the design characteristics and performance requirements of the integrated circuits that are tested using burn-in testing. The numerical values of current flow duty cycle described herein are merely indicative of the characteristics of the specific embodiments to which they refer, and are not intended to limit the scope of the present disclosure. The disable signal 681 and the bias voltage V(bias) 680, undergo signal transitions at one fourth the frequency of the clock signal 610.

Secondly, the third and fourth switching signals 693 and 694, respectively, activate one side or the other of the third CML book 593. When the third switching signal 693 activates the fifth switching FET 528, electrical current can flow through some side of the first CML book 591. When the fourth switching signal 694 activates the sixth switching FET 529, electrical current can flow through some side of the second CML book 592. The duty cycle of one side of the third CML book flowing electrical current through a branch of the integrated circuit is approximately 25% (2/8 of the first regulatory cycle 615). The third and fourth switching signals 693 and 694, respectively, undergo signal transitions at one half the rate of the clock signal 610.

Thirdly, the first switching signal 691 and the second switching signal 692 are configured to enable a side of either the first CML book 591 or the second CML book 592, respectively. When the first switching signal 691 has a high voltage, the first switching FET 524 and the third switching FET 526 can be activated, and electrical current can pass through one of them according to the status of the third and fourth switching signals 693 and 694, respectively. Similarly, the second switching signal 692 can activate both the second switching FET 525 and the fourth switching FET 527 at the same time, and electrical current can flow through one of them according to the status of the third and fourth switching signals 693 and 694, respectively. The first and second switching signals 691 and 692, respectively, undergo signal transitions at the same frequency as the clock signal 610.

A first branch electrical current I1 671 can flow through the first branch 511 of the integrated circuit 510 when the first switching signal 691, the third switching signal 693, and bias voltage V(bias) 680 have high voltages. Upon a clock signal transition such as clock signal transition 621, the second switching signal 692 can transition to a high voltage and the second branch electrical current I2 672 can flow. Upon a clock signal transition such as clock signal transition 622, the first switching signal 691 and the fourth switching signal 694 transition to a high voltage, allowing the third branch electrical current I3 673 to flow, and upon a clock signal transition such as clock signal transition 623 the second switching signal 692 can transition to a high voltage, allowing the fourth branch electrical current I4 674 to flow.

The descriptions of the various embodiments of the present disclosure have been presented for purposes of illustration, but are not intended to be exhaustive or limited to the embodiments disclosed. Various embodiments that include different numbers and locations of inverters, CML books, current control logic circuits, and other logical gates connected to switching FETs, or in the current mirror, or to the disable FET can produce embodiments that also demonstrate the breadth and scope of the present disclosure. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of regulating a flow of electrical current in an integrated circuit, the method comprising:
    sending, by a current control logic circuit, an activation signal;
    generating, by a clock signal generator, a clock signal;
    generating, by a sequencing circuit, from the clock signal, a set of sequencing signals that includes a first switching signal, a second switching signal, and a disable signal, the sequencing circuit including at least one inverter and at least one frequency divider, the first switching signal and the second switching signal generated before a first frequency divider in the sequencing circuit, the disable signal generated after the first frequency divider in the sequencing circuit;
    receiving, by a switching circuit, the first switching signal and the second switching signal; and
    receiving, by a current mirror, the activation signal and the disable signal.

2. The method of claim 1, wherein the set of sequencing signals further includes a third switching signal and a fourth switching signal, the method further comprising:
    receiving, by the switching circuit, the third switching signal and the fourth switching signal.

3. The method of claim 1, wherein the switching circuit is connected to the integrated circuit.

4. The method of claim 1, wherein the switching circuit contains a first current mode logic (CML) book, the CML book having a first switching field effect transistor (FET) with a first switching FET source, a first switching FET gate configured to receive the first switching signal, and a first switching FET drain, and a second switching FET with a second switching FET source, a second switching FET gate configured to receive the second switching signal, and a second switching FET source connected to the first switching FET source.

5. The method of claim 4, wherein the switching circuit is connected to the integrated circuit having a first branch and a second branch, and wherein the first branch is connected to the first switching FET drain and the second branch connected to the second switching FET drain.

6. The method of claim 1, wherein the clock signal has two clock signal transitions during a clock cycle, each clock signal transition between a low clock signal voltage and a high clock signal voltage, and wherein the sequencing circuit is configured to modify at least one sequencing signal upon each clock signal transition.

7. The method of claim 1, wherein the sequencing circuit includes:
    a first inverter with a first inverter output, and a first inverter input connected to the clock signal generator;
    a second inverter with a second inverter output, and a second inverter input connected to the first inverter output; and
    the first frequency divider having a first divider output, and a first divider input connected to the second inverter output.

8. The method of claim 7, wherein the sequencing circuit further includes:
    a third inverter with a third inverter output, and a third inverter input connected to the first divider output; and
    a second frequency divider with a second divider output connected to a disable field effect transistor (FET) gate in the current mirror, and a second divider input connected to the third inverter output.

9. The method of claim 7, wherein the first frequency divider is a divide by two frequency divider.

10. The method of claim 8, wherein the first frequency divider is a divide by two frequency divider.

11. The method of claim 7, wherein the first inverter converts the clock signal into the first switching signal, the second inverter converts the first switching signal into the second switching signal, and the first frequency divider converts the second switching signal into the disable signal.

12. The method of claim 8, wherein the first inverter converts the clock signal into the first switching signal, the second inverter converts the first switching signal into the second switching signal, the first frequency divider converts the second switching signal into a third switching signal, the third inverter converts the third switching signal into a fourth switching signal, and the second inverter converts the fourth switching signal into the disable signal.

13. The method of claim 1, wherein the current mirror contains a current source field effect transistor (FET) having a current source FET gate, and containing a bias FET having a bias FET source and having a bias FET gate connected to the current source FET gate by a current mirror bridge line.

14. The method of claim 13, wherein a passgate FET source is connected to the current mirror bridge line, a passgate FET drain is connected to the bias FET drain, and a passgate FET gate is connected to the current control logic circuit.

15. The method of claim 13, wherein the current mirror has a disable FET with a disable FET drain connected to the current mirror bridge line, and a disable FET gate connected to the sequencing circuit.

\* \* \* \* \*